United States Patent
Kirkpatrick et al.

(10) Patent No.: US 7,300,303 B2
(45) Date of Patent: Nov. 27, 2007

(54) METHOD AND APPARATUS FOR ATTACHING FLEXIBLE CIRCUIT TO A RIGID PRINTED CIRCUIT BOARD

(75) Inventors: Peter Kirkpatrick, San Francisco, CA (US); Joshua Oen, Fremont, CA (US); Sang Kim, Fremont, CA (US); Marc Epitaux, Sunnyvale, CA (US); Colm Hunt, Sunnyvale, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/235,394

(22) Filed: Sep. 26, 2005

(65) Prior Publication Data

US 2007/0072483 A1 Mar. 29, 2007

(51) Int. Cl.
*H01R 12/24* (2006.01)

(52) U.S. Cl. .......................... 439/492; 439/67

(58) Field of Classification Search .............. 439/67, 439/492–499
See application file for complete search history.

(56) References Cited

U.S. PATENT DOCUMENTS

| | | | |
|---|---|---|---|
| 3,629,787 A | | 12/1971 | Wilson |
| 4,169,641 A | * | 10/1979 | Olsson ........................ 439/493 |
| 4,172,626 A | * | 10/1979 | Olsson ........................ 439/329 |
| 4,181,386 A | * | 1/1980 | Olsson ........................ 439/67 |
| 4,252,389 A | * | 2/1981 | Olsson ........................ 439/65 |
| 4,252,392 A | * | 2/1981 | Whiteman, Jr. .............. 439/267 |
| 4,314,312 A | * | 2/1982 | Donmoyer et al. ........... 361/683 |
| 4,634,195 A | * | 1/1987 | Shoemaker .................. 439/493 |
| 5,074,797 A | * | 12/1991 | Yamada ....................... 439/62 |
| 5,521,459 A | * | 5/1996 | Kim ............................ 313/36 |
| 5,730,619 A | | 3/1998 | Hamlin |
| 5,971,806 A | * | 10/1999 | Evans et al. ................. 439/632 |
| 6,846,986 B1 | * | 1/2005 | Ravid et al. .................. 174/51 |
| 2007/0072483 A1 | * | 3/2007 | Kirkpatrick et al. ......... 439/492 |

FOREIGN PATENT DOCUMENTS

| | | |
|---|---|---|
| DE | 10321184 A1 | 12/2004 |
| EP | 0026568 A1 | 4/1981 |
| WO | PCT/US2006/037269 | 1/2007 |

* cited by examiner

*Primary Examiner*—James R. Harvey
(74) *Attorney, Agent, or Firm*—Blakely, Sokoloff, Taylor & Zafman LLP

(57) ABSTRACT

An apparatus comprising a spring retainer attachable to a printed circuit board and a spring having a fixed end attached to the spring retainer and a free end that contacts and exerts a force on the printed circuit board when the spring retainer is attached to the printed circuit board. A process comprising attaching a clamp to a printed circuit board, the clamp comprising a spring retainer and a spring having a fixed end attached to the spring retainer and a free end that is in contact with, and exerts a force on, the printed circuit board; and inserting a flexible circuit with one or more electrical contact pads thereon between the spring and the printed circuit board such that the electrical contact pads of the flexible circuit are pressed by the spring against corresponding electrical contact pads on the printed circuit board.

17 Claims, 5 Drawing Sheets

METHOD AND APPARATUS FOR ATTACHING FLEXIBLE CIRCUIT TO A RIGID PRINTED CIRCUIT BOARD

TECHNICAL FIELD

The present invention relates generally to connecting electronic, optical or other components and in particular, but not exclusively, to using flexible circuits to connect these components to rigid electronic components such as printed circuit boards.

BACKGROUND

Most electronic devices include various rigid components—processors, memories, optical transmitters and receivers, amplifiers, analog-to-digital converters and signal modulators are but a few examples—coupled together, either directly or indirectly by virtue of all being connected to a rigid substrate such as a printed circuit board. Flexible circuits (also commonly known as "flex circuits") have emerged as a good way to connect certain types of components to a printed circuit board. Flex circuits usually consist of some sort of flexible substrate having with one or more lines of conductive material leading from contact pads at one end of the flex circuit to a corresponding set of contact pads at the other.

Flex circuit offers various advantages. Because it is flexible, it de-couples mechanical stresses so that loads applied to one component are not transmitted to other components. Its flexibility also allows for much more variation in manufacturing tolerances, since the flex circuit can bend to accommodate tolerances that deviate, even significantly, from design dimensions. Finally, flex circuits allow the design of many different form factors that might not be possible if rigid connections to the printed circuit board were needed.

Despite their numerous advantages, however, flex circuits have one important disadvantage: they are hard to attach to a printed circuit board. One current way of attaching flex circuit to a printed circuit board is hot-bar soldering. In hot-bar soldering, the contact pads on one end of the flex circuit are aligned and put in contact with corresponding contact pads on the printed circuit board. A hot soldering bar is then lowered onto the contact pads, thus soldering the pads on the flex circuit to the pads on the printed circuit board. Hot-bar soldering has several disadvantages. Most important, it is hard to reverse and damages the flexible substrate of the flex circuit. Thus, if a flex circuit is incorrectly attached to a printed circuit board and needs to be removed, the device to which the flex circuit is attached may be rendered useless because of solder damage to the flex circuit. This can be a serious problem where the device is sensitive or very expensive.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, system and method for using flexible circuits (also known as "flex circuits") to connect electronic, optical or other components to other components such as printed circuit boards are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
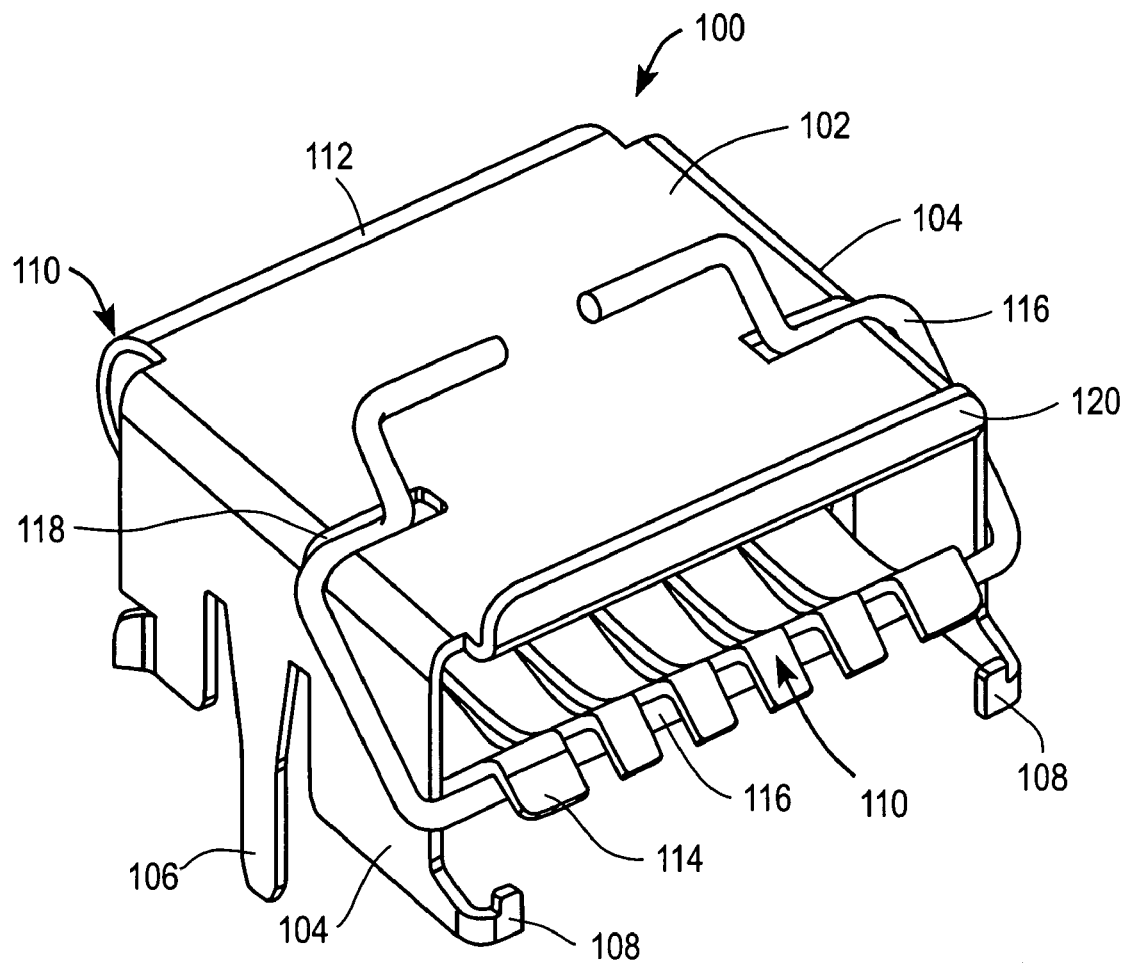
FIG. 1 is a perspective view of the top of an embodiment of the invention.
Figure 2:
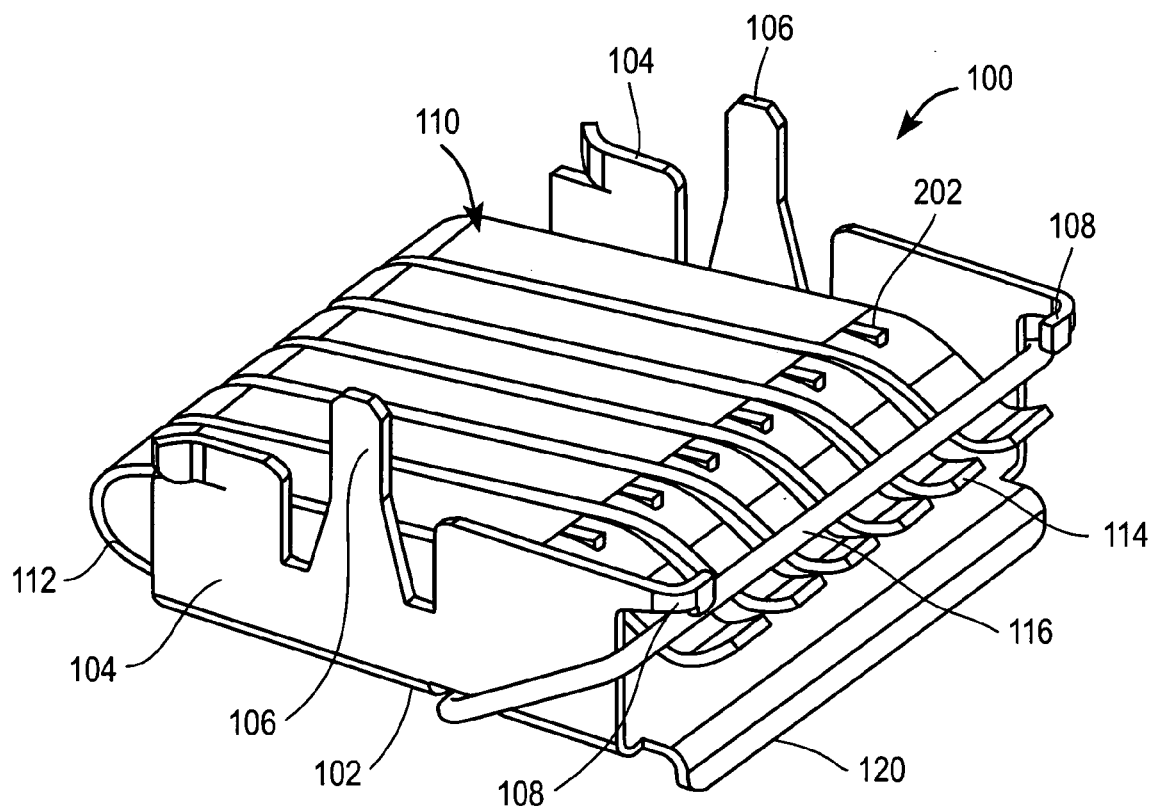
FIG. 2 is a perspective view of the bottom of the embodiment shown in FIG. 1.

FIGS. 1 and 2 together illustrate an embodiment of the invention comprising a clamp 100. As shown in FIG. 1, the clamp 100 comprises a spring retainer including a top 102 that spans between a pair of sidewalls 104. A spring 110 has a fixed end 112 and a free end 114. The fixed end 112 of spring 110 is attached to an edge of the top 102 that is unconnected to a sidewall 104. The spring 110 curls around from the fixed end 112 and extends into the volume created by the sidewalls 104 and the top 102, such that the free end 114 of spring 110 ends up near the edge of the top 102 opposite the edge where the fixed end 112 is attached. In the embodiment shown, the clamp 100 also includes a bail 116 that can be used to lift and lower the free end 114 of the spring. In one embodiment, the entire clamp 100, including the sidewalls 104, the top 102, the spring 110 and the bail 116, can be made of a material such as a metal, although in other embodiments different materials such as plastics can be used. In still other embodiments, different materials can be used for different components of the clamp 100.

The sidewalls 104 are substantially parallel and are spaced apart from each other by a distance at least as large as the width of a flexible circuit that will be secured by the clamp 100. In one embodiment of the clamp 100, the distance between the facing sides of each sidewall can be substantially equal to the width of a flexible circuit, such that the sidewalls 104 function as a guide that automatically aligns the flexible circuit as it is inserted into the clamp 100. In the embodiment shown, each sidewall 104 includes one or more tabs 106 that can be used to mount the clamp 100 onto a rigid component such as a printed circuit board. When the clamp 100 is mounted to a printed circuit board, the tabs 106 are inserted into holes in the printed circuit board and secured, for example by soldering or adhesive, or by bending the ends of the tabs 106 so that the clamp 100 is retained on the rigid component. Other embodiments can use ways other than tabs 106 to attach the clamp 100. For example, another embodiment could be a surface mount attachment in which the sidewalls 104 include flanges that can be used to attach the clamp to the printed circuit board with fasteners, adhesives or solder. In another example, the sidewall can include no tabs or flanges and the lower edge of each sidewall can be attached directly to the rigid component, for example by using solder, adhesive or the like. Each sidewall 104 can also include a pawl 108 that functions as a stop for aligning a flex circuit inserted in the clamp.

The top 102 spans between the sidewalls 104 and provides an attachment point for the fixed end 112 of spring 110, so that the spring will be able to exert a force upon a flex circuit that will be clamped to a rigid component. The top 102 also includes a pair of slots 118 located near the sidewalls and a lip 120 on the edge opposite where the fixed end 112 of the spring is attached. The slots 108 are designed to engage the bail 116 when the bail is used to lift the free end 114 of the spring, thus holding the free end 114 up while a flex circuit is inserted in the clamp. Once the flex circuit is positioned in the clamp, the bail 116 is released from the slots 118, causing the free end 114 of the spring to come down upon, and exert a force on, the flex circuit. The lip 120 keeps the bail from sliding off the clamp.

The spring 110 works in conjunction with the top 102 and sidewalls 104 to clamp a flex circuit to a rigid circuit component. The spring 110 is a leaf spring with its fixed end 112 attached to the top 102 of the clamp and with its free end 114 being approximately even with edge of top 102 opposite where the fixed end 112 of the spring is attached. In other embodiments of the clamp 100, any type of springs or elastic materials can be used, so long as they can exert a force that will clamp the flex circuit to the rigid circuit.

Figure 3A:
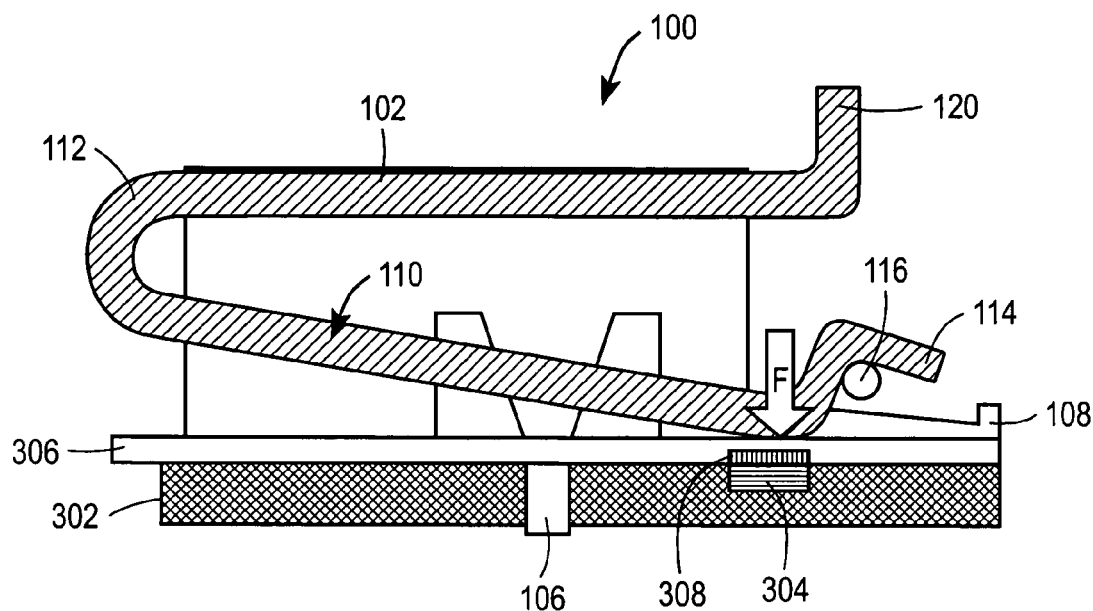
FIG. 3A is a sectional elevation of the embodiment shown in FIG. 1.
Figure 3B:
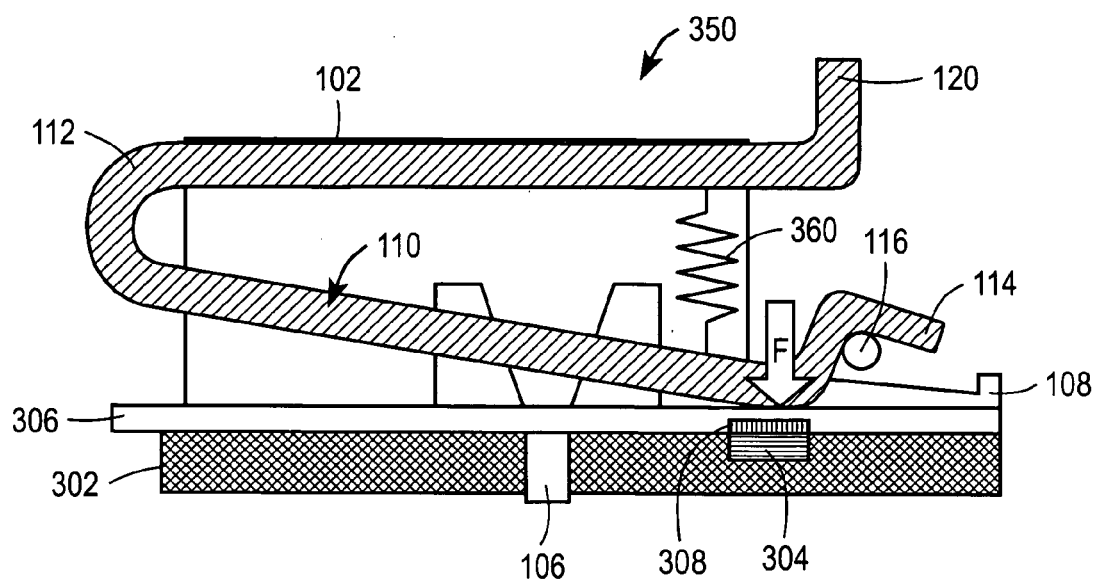
FIG. 3B is a sectional elevation of an alternative embodiment of the invention.

Except near the fixed end 112, the spring 110 is partitioned into several prongs, each prong corresponding to contact pads on the flex circuit and the rigid component (see FIGS. 3A and 3B). In other embodiments the free end 114 can include more, less or different shaped prongs or can be undivided into prongs. The prongs at the free end 114 also include some curvature to accommodate and retain the bail 116. In embodiments of the clamp 100 that do not include a bail, the curvature at the free end 114 can be used to accommodate a tool that can be used to lift the free end 114 so that a flex circuit can be inserted. In still other embodiments of the clamp 100, other provisions besides curving the end 114 an be used to accommodate a means of lifting the spring.

The bail 116 is used to lift and lower the free end 114 of the spring 110 so that a flex circuit can be clamped and unclamped, respectively. The bail 116 is threaded under the curvature in the prongs at the free end 114 and it other end is then looped over the lip 120, which keeps the bail from sliding off the top 102. The bail is used to lift the free end 114 of the spring, thus holding the free end 114 up while a flex circuit is inserted in the clamp. Once the flex circuit is positioned in the clamp 100, the bail 116 is released from the slots 118, causing the free end 114 of the spring to come down upon, and exert a force on, the flex circuit.

FIG. 2 is a bottom view of the clamp 100 that further illustrates the construction of spring 110, which works in conjunction with the other elements of the clamp 100 to clamp a flex circuit to a rigid circuit component. The spring 110 is a leaf spring with its fixed end 112 attached to the top 102 of the clamp and with its free end 114 being nearly aligned with side of top 102 opposite where the fixed end 112 is attached. Except at the fixed end 112, the spring 110 is partitioned into several prongs, but in other embodiments the spring 110 can include more, less or different shaped prongs than shown, or can be undivided into prongs. The part of each prong that will contact the flex circuit and clamp it to the rigid component can also include a barb 202 to improve clamping action. The prongs at the free end 114 include some curvature to accommodate and retain the bail 116, if present, or a tool that can be used to lift the free end 114 so that a flex circuit can be inserted.

FIG. 3A further illustrates an embodiment of the clamp 100 installed on a rigid component such as printed circuit board 302 and used to attach an external component or device (not shown in this figure; see FIGS. 4 and 5) to the printed circuit board 302 via a flexible circuit (or "flex circuit") 306. The printed circuit board 302 includes one or more contact pads 304 designed to provide electrical connection between electronic components mounted on the printed circuit board 302 and the component that will be connected to the printed circuit board via the flex circuit 306.

The clamp 100, as before, includes the top 102, sidewalls 104 and spring 110. The clamp 100 is mounted to the printed circuit board 302 using the tabs 106 that are part of each sidewall 104. As discussed above, the tabs 106 can be inserted in holes in the printed circuit board and secured to the printed circuit board. Once the clamp 100 is installed on the printed circuit board 302, the free end 114 of the spring 110 is lifted, using the bail 116 or some other tool, so that the flex circuit 306 can be inserted into the clamp. As discussed above, the spacing between sidewalls 104 and the position of the pawls 108 can be designed such that when the flex circuit 306 is inserted in the clamp the contact pads 308 in the flex circuit are automatically aligned with the contact pads 304 in the printed circuit board 302 and with the spring 110.

Once the flex circuit 306 is inserted into the clamp and properly aligned, the free end 114 of spring 110 is lowered such that it applies a force F on the flex circuit, thus pressing the contact pads 308 of the flex circuit into electrical contact with the contact pads 304 of the printed circuit board. Removing the flex circuit 306 from the printed circuit board 302 simply requires a reversal of this procedure.

FIG. 3B illustrates an alternative embodiment of a clamp 350. The clamp 350 is similar in construction to the clamp 100, the primary difference being the addition of an elastic member such as spring 360. If the force F provided by the spring 110 is not sufficient to push the contact pads 308 into electrical contact with the contact pads 304, an additional elastic member such as spring 360 can be added between the top 102 and the spring 110. Although spring 360 is represented in the figure as a coil spring, in other embodiments other types of elastic members could be substituted, such as visco-elastic materials, other leaf springs, and the like. In addition, although only a single spring 360 is shown, in other embodiments multiple springs or other elastic members could be used.

Figure 4:
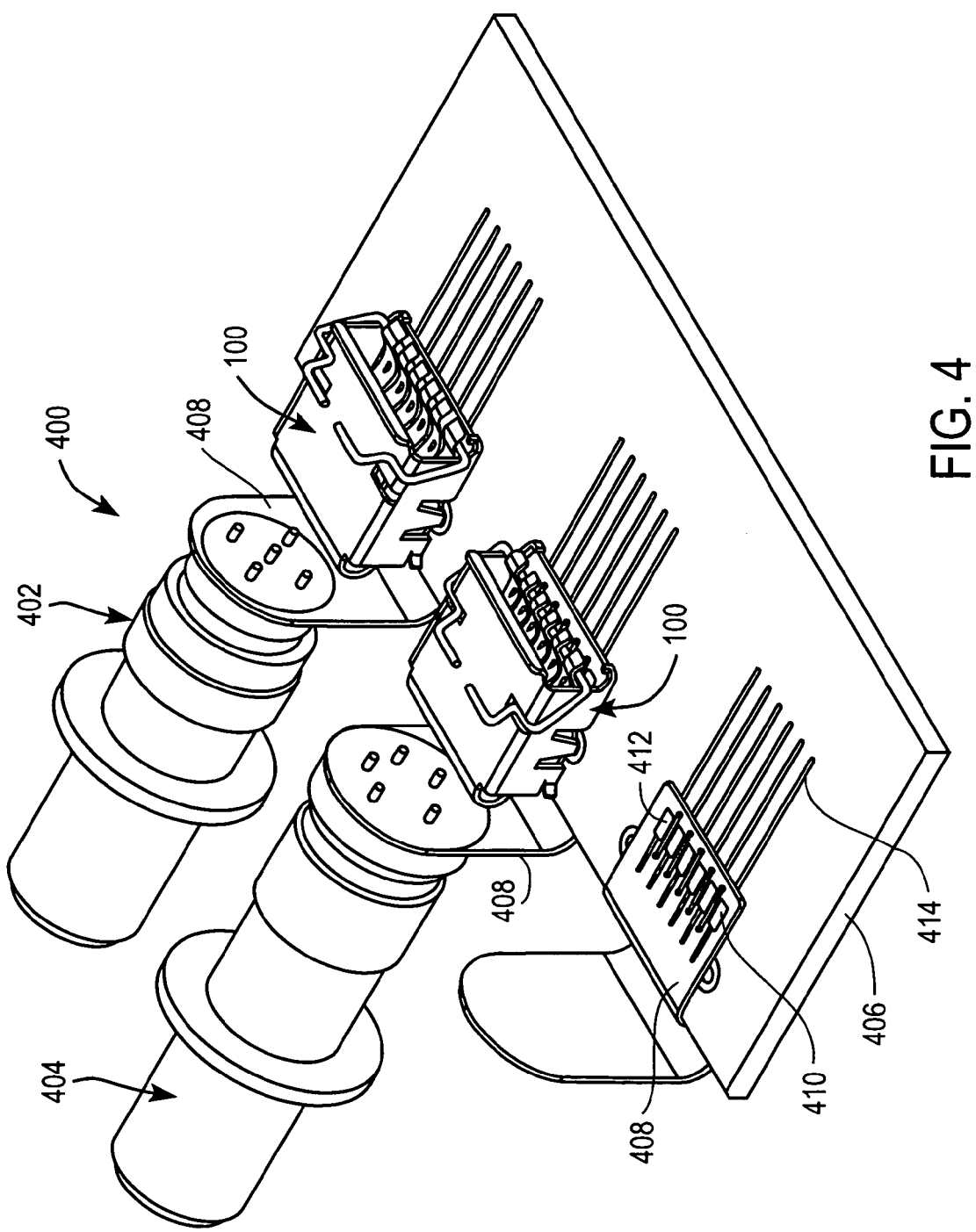
FIG. 4 is a perspective view of an embodiment of a system including the embodiment shown in FIG. 1.

FIG. 4 is a perspective view illustrating an embodiment of an application 400 of the clamp 100. A pair of clamps 100 is mounted to the printed circuit board 406, for example by using the tabs 106 that are part of each sidewall 104. For each device 402 and 404 to be attached, the printed circuit board 406 includes one or more contact pads 412, each of which should have a corresponding contact pad 410 in the flex circuit 408. Circuit lines 414 electrically connect each contact pad 412 to other components mounted on the printed circuit board. Each clamp 100 is positioned over its corresponding contact pads.

Devices or components such as optical assemblies 402 and 404 are connected to printed circuit board 406 using flex circuits 408 attached to the printed circuit board 406 by the clamps 100. The clamp 100 connecting the device 402 to the printed circuit board 406 is shown in its closed position (i.e., with the free end 114 of spring 110 lowered), while the clamp 100 connecting the device 404 to the printed circuit board is shown in its open position (i.e., with the free end 114 of spring 110 lifted). In other embodiments, the devices or components 402 and 404 can be other types of devices, such as electronic devices.

Figure 5:
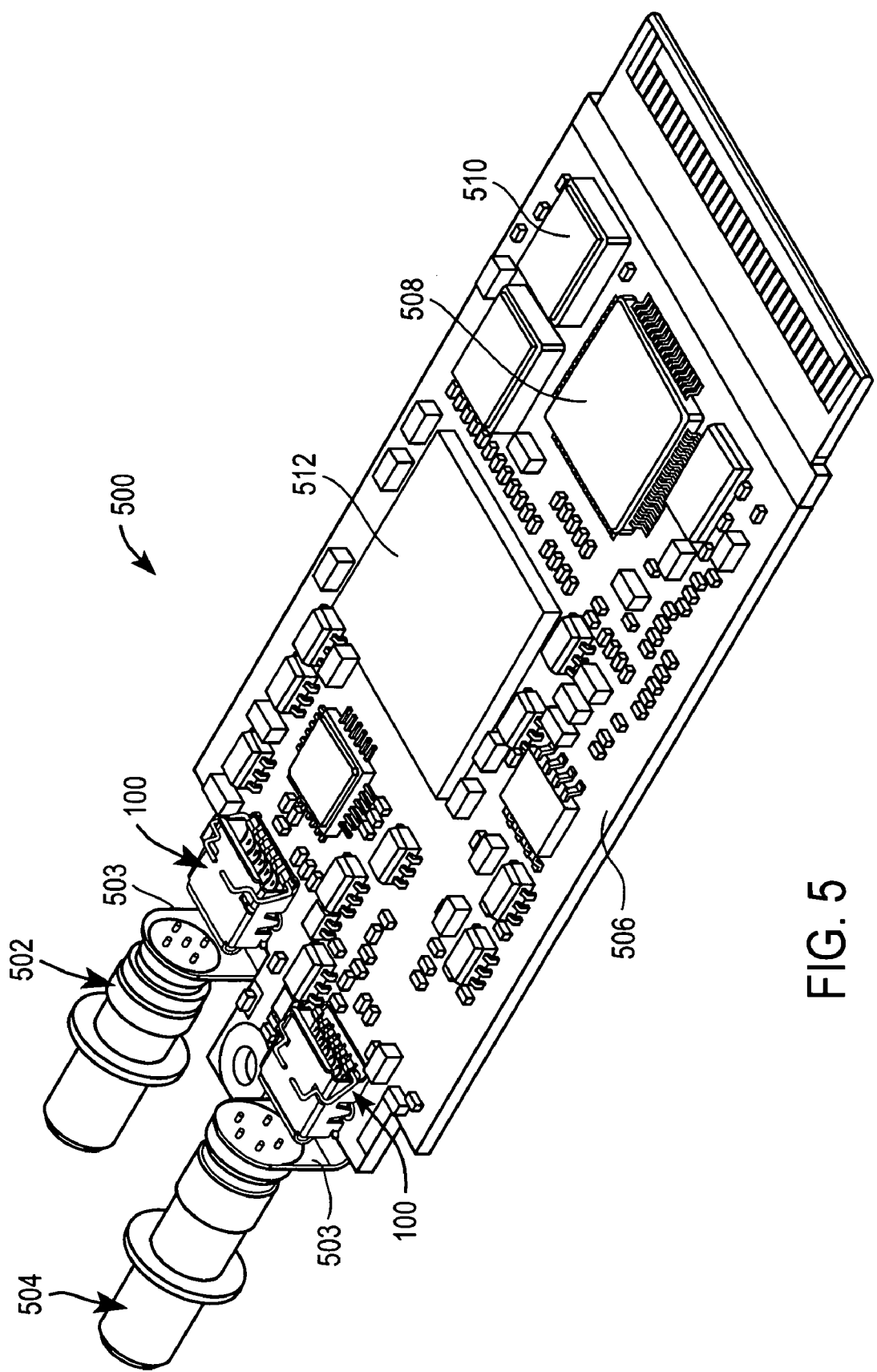
FIG. 5 is a perspective view of an embodiment of an optical communication system including the embodiment of the invention shown in FIG. 1.

FIG. 5 illustrates an embodiment of an optical communication system 500 including a pair of clamps 100. Of course, the clamps 100 can be used in any system using components connected with flex circuit. As in the system 500, the clamps 100 are mounted to the printed circuit board 506, for example by using the tabs 106, such that they are positioned over their corresponding contact pads. Devices or components such as optical transmitter 502 and receiver 504 are electrically connected to printed circuit board 506 using flex circuits 503 attached to the printed circuit board 506 by the clamps 100. The clamp 100 connecting the transmitter 502 to the printed circuit board 506 is shown in its closed position (i.e., with the free end 114 of spring 110 lowered), while the clamp 100 connecting the receiver 504 to the printed circuit board is shown in its open position (i.e., with the free end 114 of spring 110 raised). In other embodiments, the transmitter 502 and receiver 504 can be other types of devices, such as electronic devices.

In addition to the transmitter 502 and receiver 504 that are connected to the printed circuit board 506 via flex circuits and clamps 100, the optical communication system 500 includes other electronic components such as micro-controller 508, a memory 510 such as SRAM, DRAM or SDRAM and an electronic transceiver 512 that support the functions of the transmitter 502 and receiver 504, as well as signal processors, analog-to-digital converters, amplifiers, optical sensors, signal modulators, voltage regulators, etc. Of course, in other embodiments the printed circuit board can include more, less or different components.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
    a spring retainer attachable to a printed circuit board;
    a spring having a fixed end and a free end, wherein the fixed end is attached to the spring retainer and the free end is in contact with, and exerts a force on, the printed circuit board when the spring retainer is attached to the printed circuit board;
    a bail coupled to the free end of the spring, wherein when the spring retainer is attached to the printed circuit board the bail has a closed position in which the free end of the spring is in contact with the printed circuit board and an open position in which the free end of the spring is lifted from the printed circuit board; and
    a locking mechanism comprising a pair of slots in the spring retainer to engage and removably hold the bail in the open position.

2. The apparatus of claim 1 wherein the spring retainer comprises a pair of spaced-apart sidewalls and a top wall joining edges of the sidewalls, such that the top wall, the sidewalls and the printed circuit board define a volume when the spring retainer is attached to the printer circuit board.

3. The apparatus of claim 2 wherein the fixed end of the spring is integrally formed with the top wall and the spring extends into the volume such that the free end of the spring is in contact with, and exerts a force upon, the printed circuit board.

4. The apparatus of claim 2 wherein each sidewall includes a tab to be inserted in the printed circuit board.

5. The apparatus of claim 1 wherein the spring includes one or more prongs, each prong corresponding in position to a contact pad on the printed circuit board when the spring retainer is attached to the printed circuit board.

6. The apparatus of claim 5 wherein each prong includes a barb.

7. The apparatus of claim 1, further comprising one or more additional elastic members to increase the downward force exerted by the spring on the printed circuit board.

8. A system comprising:
    a printed circuit board including a memory coupled to one or more electrical contact pads; and
    a clamp attached to the printed circuit board and positioned over the electrical contact pads, the clamp including:
        a spring retainer attached to the printed circuit board,
        a spring having a fixed end and a free end, wherein the fixed end is attached to the spring retainer and the free end is in contact with, and exerts a force on, the printed circuit board,
        a bail coupled to the free end of the spring, wherein when the spring retainer is attached to the printed circuit board the bail has a closed position in which the free end of the spring is in contact with the printed circuit board and an open position in which the free end of the spring is lifted from the printed circuit board, and
        a locking mechanism comprising a pair of slots in the spring retainer to engage and removably hold the bail in the open position.

9. The system of claim 8, further comprising a device including a flexible circuit with one or more electrical contact pads thereon, the electrical contact pads of the flexible circuit corresponding in position to the electrical contact pads of the printed circuit board, wherein the flexible circuit is inserted between the spring and the printed circuit board such that the electrical contact pads of the flexible circuit are pressed by the spring against the corresponding electrical contact pads on the printed circuit board.

10. The system of claim 8 wherein the spring retainer comprises a pair of spaced-apart sidewalls and a top wall joining edges of the sidewalls, such that the top wall, the sidewalls and the printed circuit board define a volume when the spring retainer is attached to the printer circuit board.

11. The system of claim 10 wherein the fixed end of the spring is integrally formed with the top wall and the spring extends into the volume such that the free end of the spring is in contact with, and exerts a force upon, the printed circuit board.

12. The system of claim 10 wherein each sidewall includes a tab to be inserted in the printed circuit board.

13. The system of claim 10 wherein each sidewall includes a flange that allows the clamp to be attached to the surface of the printed circuit board.

14. The system of claim 8 wherein the clamp further comprises one or more additional elastic members to increase the downward force exerted by the spring on the printed circuit board.

15. A process comprising:
   attaching a clamp to a printed circuit board, the clamp being positioned over one or more contact pads on the printed circuit board and comprising:
      a spring retainer attached to the printed circuit board,
      a spring having a fixed end and a free end, wherein the fixed end is attached to the spring retainer and the free end is in contact with, and exerts a force on, the printed circuit board, and
      a bail coupled to the free end of the spring, wherein when the spring retainer is attached to the printed circuit board the bail has a closed position in which the free end of the spring is in contact with the printed circuit board and an open position in which the free end of the spring is lifted from the printed circuit board; and
   locking the bail in the open position by engaging the bail in a pair of slots on the spring retainer;
   inserting a flexible circuit with one or more electrical contact pads thereon between the spring and the printed circuit board; and
   unlocking the bail and moving it to the closed position such that the electrical contact pads of the flexible circuit are pressed by the free end of the spring against the corresponding electrical contact pads on the printed circuit board.

16. The process of claim 15, further comprising using one or more additional elastic members to increase the downward force exerted by the spring on the flexible circuit and the printed circuit board.

17. The process of claim 15 wherein attaching the clamp to the printed circuit board comprises inserting one or more tabs through holes in the printed circuit board.

* * * * *